United States Patent
Li et al.

(10) Patent No.: US 11,978,643 B2
(45) Date of Patent: May 7, 2024

(54) METHOD FOR MANUFACTURING SEMICONDUCTOR DEVICE INCLUDING PERFORMING THERMAL TREATMENT ON SUBSTRATE AND SEMICONDUCTOR DEVICE

(71) Applicant: CHANGXIN MEMORY TECHNOLOGIES, INC., Hefei (CN)

(72) Inventors: Xiaojie Li, Hefei (CN); Dahan Qian, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 10 days.

(21) Appl. No.: 17/845,119

(22) Filed: Jun. 21, 2022

(65) Prior Publication Data

US 2023/0223275 A1    Jul. 13, 2023

Related U.S. Application Data

(63) Continuation of application No. PCT/CN2022/078070, filed on Feb. 25, 2022.

(30) Foreign Application Priority Data

Jan. 12, 2022    (CN) .......................... 202210032039.6

(51) Int. Cl.
*H01L 21/477*    (2006.01)
*C23C 16/455*    (2006.01)
(Continued)

(52) U.S. Cl.
CPC ...... *H01L 21/477* (2013.01); *C23C 16/45525* (2013.01); *H01L 21/02365* (2013.01); *H01L 21/027* (2013.01); *H01L 21/302* (2013.01)

(58) Field of Classification Search
CPC ............. H01L 21/477; H01L 21/02365; H01L 21/027; H01L 21/302; H01L 21/28088;
(Continued)

(56) References Cited

U.S. PATENT DOCUMENTS 7,528,024 B2    5/2009   Olombo
10,332,831 B2   6/2019   Hong
(Continued)

FOREIGN PATENT DOCUMENTS

CN    102299155 A    12/2011
CN    104377236 A     2/2015
(Continued)

OTHER PUBLICATIONS

L. Wu, X. Li, Al. "Investigation of ALD or PVD (Ti-rich vs. N-rich) TiN Metal Gate Thermal Stability on HfO2 High-k", 2 pages 2010.

*Primary Examiner* — Kretelia Graham
*Assistant Examiner* — Adin Hrnjic
(74) *Attorney, Agent, or Firm* — Cooper Legal Group, LLC

(57) ABSTRACT

Method for manufacturing a semiconductor device includes: forming a first area and a second area of a peripheral area on a substrate; forming a first lamination structure in the first area, and forming a second lamination structure in an array area and the second area; performing thermal treatment on the substrate so that atoms in a work function layer are diffused into a second dielectric layer, and an interface interaction occurs between the second dielectric layer and a first dielectric layer; removing the first lamination structure to the second dielectric layer, and removing the second lamination structure to the second dielectric layer; forming a fourth barrier layer and a second conductive layer, a content ratio of metallic element to non-metallic element in a first barrier layer being less than a content ratio of metallic (Continued)

element to non-metallic element in a second barrier layer and a third barrier layer.

17 Claims, 12 Drawing Sheets

(51) Int. Cl.
  *H01L 21/02* (2006.01)
  *H01L 21/027* (2006.01)
  *H01L 21/302* (2006.01)
(58) Field of Classification Search
  CPC ......... H01L 21/02255; H01L 21/76828; H01L 29/66545; H01L 23/5226; H01L 21/76802; H01L 21/11568; H10B 43/40; H10B 41/49; H10B 12/01; H10B 12/50
  See application file for complete search history.

(56) References Cited

U.S. PATENT DOCUMENTS

| | | |
|---|---|---|
| 2005/0258468 A1 | 11/2005 | Colombo |
| 2006/0216418 A1 | 9/2006 | Matsuura |
| 2010/0151676 A1* | 6/2010 | Ritchie .................. C23C 16/34 257/E21.477 |
| 2015/0123238 A1* | 5/2015 | Jang ....................... H10B 12/01 257/503 |
| 2015/0170974 A1* | 6/2015 | Xu .......................... H01L 29/78 438/232 |
| 2018/0158773 A1* | 6/2018 | Hong ................ H01L 21/76802 |
| 2019/0326278 A1* | 10/2019 | Lee ................ H01L 21/823807 |
| 2019/0341314 A1* | 11/2019 | Ando .................. H01L 27/0922 |
| 2023/0071140 A1* | 3/2023 | Sato ........................ H01L 22/12 |

FOREIGN PATENT DOCUMENTS

| | | |
|---|---|---|
| CN | 108022882 A | 5/2018 |
| CN | 108155173 A | 6/2018 |
| CN | 109728078 A | 5/2019 |
| CN | 110233098 A | 9/2019 |
| CN | 112635401 A | 4/2021 |
| JP | 4607637 B2 | 1/2011 |
| KR | 20090048189 A | 5/2009 |

* cited by examiner

METHOD FOR MANUFACTURING SEMICONDUCTOR DEVICE INCLUDING PERFORMING THERMAL TREATMENT ON SUBSTRATE AND SEMICONDUCTOR DEVICE

CROSS-REFERENCE TO RELATED APPLICATIONS

This is a continuation application of International Patent Application No. PCT/CN2022/078070, filed on Feb. 25, 2022, which claims priority to Chinese Patent Application No. 202210032039.6, filed on Jan. 12, 2022 and entitled "SEMICONDUCTOR DEVICE AND METHOD FOR MANUFACTURING SAME". The disclosures of International Patent Application No. PCT/CN2022/078070 and Chinese Patent Application No. 202210032039.6 are incorporated by reference herein in their entireties.

BACKGROUND

A High-K Metal Gate (HKMG) stacking process has been introduced at a 45 nm process node to resolve the technical obstacle faced by conventional gate.

In a conventional process flow of an HKMG semiconductor device, during the stacking of HKMG film layers, high-temperature annealing is usually performed on a film layer stack structure after film layers are stacked, so as to reduce defects of metal gates. However, in a manufacturing process of the metal gates, a barrier layer in the film layer stack structure may affect the formation of the HKMG, resulting in high threshold voltage, thereby affecting the performance of the semiconductor device.

It is to be noted that, information disclosed in the above Background section is merely for enhancement of understanding of the background of the disclosure, and may include information not constituting the prior art that is already known to those of ordinary skill in the art.

SUMMARY

The disclosure relates to the technical field of semiconductors, and in specifically, to a semiconductor device and a method for manufacturing the same.

In order to overcome disadvantages in the prior art, the disclosure provides a semiconductor device and a method for manufacturing the same. The method for manufacturing a semiconductor device may change a content ratio of metallic element to non-metallic element in different barrier film layers, so that processing of a semiconductor can be optimized.

According to an aspect of the disclosure, there is provided a method for manufacturing a semiconductor device. The method includes the following operations.

A substrate including an array area and a peripheral area is provided. The peripheral area includes a first area and a second area.

A first dielectric layer, a second dielectric layer, a first barrier layer, a first work function layer, and a second barrier layer are successively formed on the substrate.

The second barrier layer in the first area and the first work function layer in the first area are removed, and then a second work function layer, a third barrier layer, and a first conductive layer are successively formed on the substrate.

A thermal treatment is performed on the substrate, so that atoms in the second work function layer in the first area are diffused into the second dielectric layer, atoms in the first work function layer in the second area are diffused into the second dielectric layer, and an interface interaction occurs between the second dielectric layer and the first dielectric layer.

The first conductive layer, the third barrier layer, the second work function layer, and the first barrier layer in the first area are removed, and the first conductive layer, the third barrier layer, the second work function layer, the second barrier layer, the first work function layer, and the first barrier layer in the array area and the second area are removed.

A fourth barrier layer and a second conductive layer are formed in the first area and the second area.

A content ratio of a metallic element to a non-metallic element in the first barrier layer is less than a content ratio of a metallic element to a non-metallic element in the second barrier layer and the third barrier layer.

According to another aspect of the disclosure, there is provided a semiconductor device. The semiconductor device includes a substrate, a first dielectric layer, a second dielectric layer, a barrier layer, and a conductive layer.

The substrate includes an array area and a peripheral area, and the peripheral area includes a first area and a second area.

The first dielectric layer is located on the peripheral area.

The second dielectric layer is located on the first dielectric layer and in the array area, and an interface interaction occurs in an interface between the first dielectric layer and the second dielectric layer.

The barrier layer is located on the second dielectric layer.

The conductive layer is located on the barrier layer.

A content ratio of a metallic element to a non-metallic element in the barrier layer is greater than 1.

It should be understood that, the above general description and the following detailed description are merely exemplary and explanatory, and cannot limit the disclosure.

BRIEF DESCRIPTION OF THE DRAWINGS

Drawings are incorporated into the specification and constitute a part of the specification. The drawings illustrate embodiments in accordance with the disclosure and serve to explain the principles of the disclosure together with the specification. It is apparent that the drawings in the following description are merely some embodiments of the disclosure. Other drawings can be obtained by those skilled in the art according to these drawings without any creative work.

Figure 1:
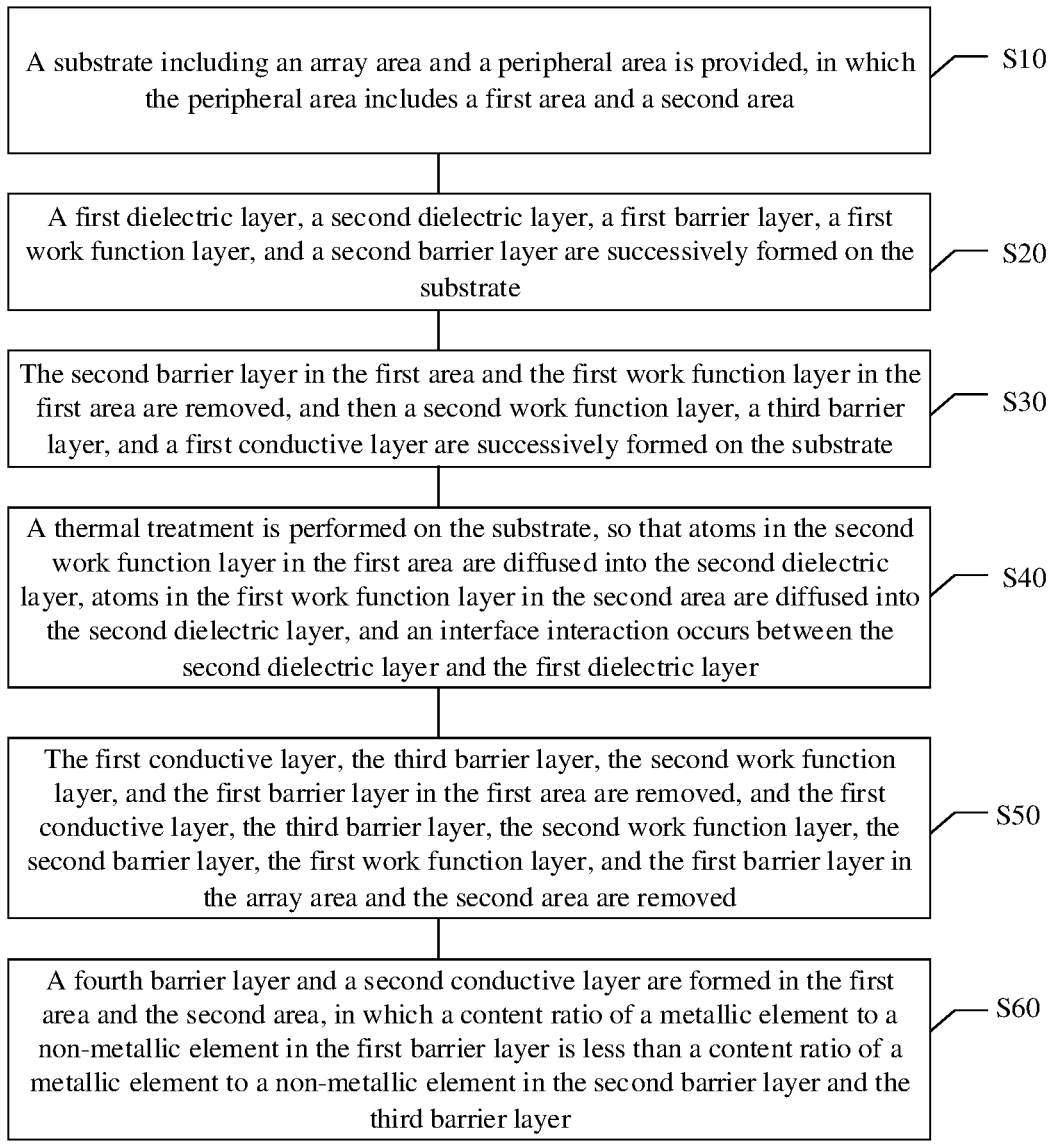
FIG. 1 is a schematic manufacturing flowchart of a method for manufacturing a semiconductor device according to an exemplary embodiment of the disclosure.

Reference signs in the drawings are as follows.

10: Array area; 20: Peripheral area;
100: Substrate; 101: Trench; 1011: Barrier material layer;
102: Storage structure; 1021: Gate isolation layer;

1022: Gate conductive layer; 201: First dielectric layer;
202: Second dielectric layer; 203: Strain layer;
301: First barrier layer; 302: Second barrier layer;
303: Third barrier layer; 304: Fourth barrier layer;
401: First work function layer; 402: Second work function layer;
501: First conductive layer; 502: Second conductive layer; 600: Isolation layer;
A: First area; B: Second area;
N1: First N area; N2: Second N area;
P1: First P area; P2: Second P area;
PR: Photoresist.

DETAILED DESCRIPTION

Exemplary implementations are described more comprehensively with reference to the drawings. However, exemplary implementations can be implemented in various forms and should not be construed as being limited to the implementations set forth herein. In contrast, these implementations are provided for more thorough and complete understanding of the disclosure, and to fully convey the concept of the exemplary implementations to a person skilled in the art. The same reference numerals in the drawings denote same or similar structures, and thus detailed descriptions will be omitted. In addition, the drawings are merely schematic illustrations of the disclosure and are not necessarily drawn to scale.

The following description of different exemplary implementations of the disclosure is made with reference to the drawings. The drawings form a part of this disclosure and show, by way of examples, different exemplary structures, systems, and steps in which various aspects of the disclosure may be implemented. It is to be understood that, other specific solutions of components, structures, exemplary apparatuses, systems, and steps may be utilized, and structural and functional modifications may be made without departing from the scope of the disclosure. In addition, although the terms "on", "between", and "within" may be used in this specification to describe different exemplary features and elements of the disclosure, but these terms are used herein for convenience only, such as according to a direction of an example described in the drawings. Any content in this specification should not be construed as requiring a specific three-dimensional direction of a structure to fall within the scope of the disclosure.

The terms "a", "an", "the", "said" and "at least one" are used to indicate the presence of one or more elements/components/and the like. The terms "including/include(s)" and "having/have/has" are used to indicate an open-ended inclusive meaning and mean that additional elements/components/and the like may be present in addition to the listed elements/components/and the like. The terms "first", "second", "third", and the like are merely used as marks and are not intended to limit the number of objects.

As for a Dynamic Random Access Memory (DRAM), in a conventional process flow of a High-K Metal Gate (HKMG) semiconductor device, for example, a Complementary Metal Oxide Semiconductor (CMOS) device, in which the CMOS includes a Negative channel Metal Oxide Semiconductor (NMOS) area and a Positive channel Metal Oxide Semiconductor (PMOS) area, and a Shallow Trench Isolation (STI) structure is formed between the NMOS area and the PMOS area, with miniaturization of the semiconductor device and considering requirements of gate performance, a metal gate is formed. In order to further improve the performance of the semiconductor device in the prior art, after a metal gate structure is formed, high-temperature annealing is performed on the device, such as 1000° C. spike annealing, so that defects in the metal gate may be reduced.

However, in a manufacturing process of the HKMG semiconductor device, since the barrier layers have different functions as different layers of films in the stacked layer film structure, the barrier layers may affect the performance of the HKMG semiconductor device. Therefore, in the disclosure, based on the impact of different ratios of the metallic element to the non-metallic element in the barrier layer on the process for manufacturing the semiconductor device with high dielectric constant, a semiconductor device and a method for manufacturing the same are provided, to optimize the process for manufacturing the semiconductor device with high dielectric constant, and improve the performance of the semiconductor device.

The method for manufacturing a semiconductor device provided in the disclosure is described by taking application to a DRAM as an example. Those skilled in the art easily understand that, in order to apply related design of the disclosure to other types of semiconductor structures, various modifications, additions, substitutions, deletions or other changes are made to the following specific implementations, and these changes are still within the scope of the principle of the method for manufacturing the semiconductor structure provided in the disclosure.

An implementation of the disclosure provides a method for manufacturing a semiconductor device. As shown in FIG. 1, the method includes the following steps.

At S10, a substrate 100 including an array area 10 and a peripheral area 20 is provided. The peripheral area 20 includes a first area A and a second area B.

At S20, a first dielectric layer 201, a second dielectric layer 202, a first barrier layer 301, a first work function layer 401, and a second barrier layer 302 are successively formed on the substrate 100.

At S30, the second barrier layer 302 in the first area A and the first work function layer 401 in the first area A are removed, and then a second work function layer 402, a third barrier layer 303, and a first conductive layer 501 are successively formed on the substrate 100.

At S40, a thermal treatment is performed on the substrate 100, so that atoms in the second work function layer 402 in the first area A are diffused into the second dielectric layer 202, atoms in the first work function layer 401 in the second area B are diffused into the second dielectric layer 202, and an interface interaction occurs between the second dielectric layer 202 and the first dielectric layer 201.

At S50, the first conductive layer 501, the third barrier layer 303, the second work function layer 402, and the first barrier layer 301 in the first area A are removed, and the first conductive layer 501, the third barrier layer 303, the second work function layer 402, the second barrier layer 302, the first work function layer 401, and the first barrier layer 301 in the array area 10 and the second area B are removed.

At S60, a fourth barrier layer 304 and a second conductive layer 502 are formed in the first area A and the second area B. A content ratio of a metallic element to a non-metallic element in the first barrier layer 301 is less than a content ratio of a metallic element to a non-metallic element in the second barrier layer 302 and the third barrier layer 303.

Through the above processing flow, compared with the solution in the prior art that a constant ratio value of metallic element to non-metallic element is utilized in different barrier layers, in the present disclosure, different ratio values of the metallic element to the non-metallic element are utilized in different barrier layers. In a processing flow, different content ratios of different elements may achieve different process effects. By taking the barrier layer being a titanium nitride layer as an example, in a case that a value of the ratio of titanium to nitrogen in the titanium nitride layer is large, the resistance of the titanium nitride layer is decreased, oxygen capture capacity is better, and atoms in the work function layer located above or under the titanium nitride layer are difficult to diffuse. In a case that a value of the ratio of titanium to nitrogen in the titanium nitride layer is small, the resistance value of the titanium nitride layer is increased, and the atoms in the work function layer located above or under the titanium nitride layer are easy to diffuse. Based on the above characteristics of the barrier layer, different ratio values of the metallic element to the non-metallic element are utilized in different barrier layers in the process engineering of semiconductors, to control the diffusion of the atoms in the work function layer into the dielectric layer, so that the interface interaction generated among different dielectric film layers in the dielectric layer is controlled. Therefore, a voltage threshold of a transistor in the semiconductor device can be stabilized, thereby optimizing the processing of the semiconductor device, and improving the performance of the semiconductor device.

FIG. 2 to FIG. 10 are schematic diagrams respectively typically showing a film layer stack structure of a semiconductor structure in several steps of an exemplary implementation of a method for manufacturing the semiconductor structure. Process steps of the method for manufacturing a semiconductor device provided in the disclosure are described in detail below with reference to the above figures.

At S10, a substrate 100 including an array area 10 and a peripheral area 20 is provided, where the peripheral area 20 includes a first area A and a second area B.

Figure 2:
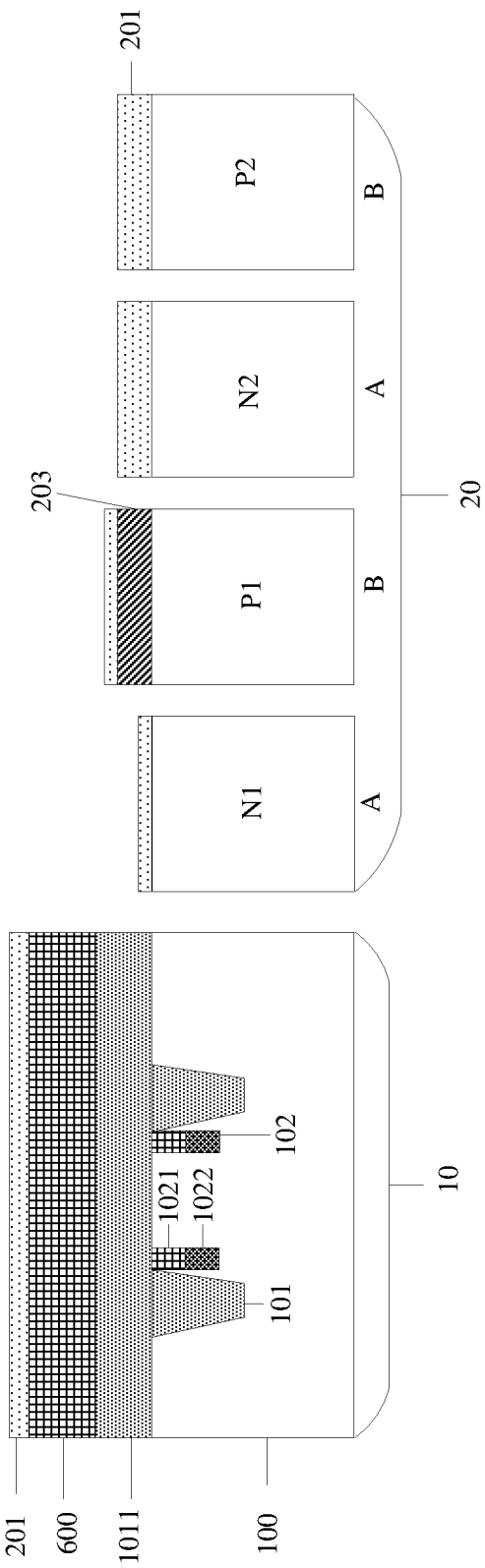
FIG. 2 to FIG. 10 are schematic diagrams illustrating stacking of film layers of a semiconductor structure in a method for manufacturing a semiconductor device according to exemplary embodiments of the disclosure.

As shown in FIG. 2, the method for manufacturing a semiconductor device provided in the disclosure takes a CMOS device as an example. The substrate 100 includes the array area 10 and the peripheral area 20, and the peripheral area 20 includes the first area A and the second area B. A plurality of Shallow Trench Isolation (STI) structures are formed in the substrate 100. The STI structure may be formed by filling an isolation material in a trench 101 after the trench 101 is formed in the substrate 100. The isolation material may include at least one of silicon nitride, silicon oxide, or silicon carbonitride, which is not specially limited herein. A storage structure 102 is buried in the array area 10. The storage structure 102 at least includes a gate isolation layer 1021 and a gate conductive layer 1022. The gate isolation layer 1021 may be made of a material including at least one of the silicon nitride, the silicon oxide, or the silicon carbonitride. The gate conductive layer 1022 may be made of a material including at least one of tungsten, titanium nitride, or polycrystalline silicon. A specific film of layer of the storage structure 102 is determined according to an actual structure. The storage structure 102 is configured to write, erase, or store data.

The peripheral area 20 includes the first area A and the second area B. The first area A includes an N area forming an N-type device, and the N area includes a first N area N1 and a second N area N2. The second area B includes a P area forming a P-type device, and the P area includes a first P area P1 and a second P area P2.

The substrate 100 may be made of silicon or other semiconductor materials, and a material of the substrate 100 is not specially limited in the disclosure.

At S20, the first dielectric layer 201, the second dielectric layer 202, the first barrier layer 301, the first work function layer 401, and the second barrier layer 302 are successively formed on the substrate 100.

Figure 3:
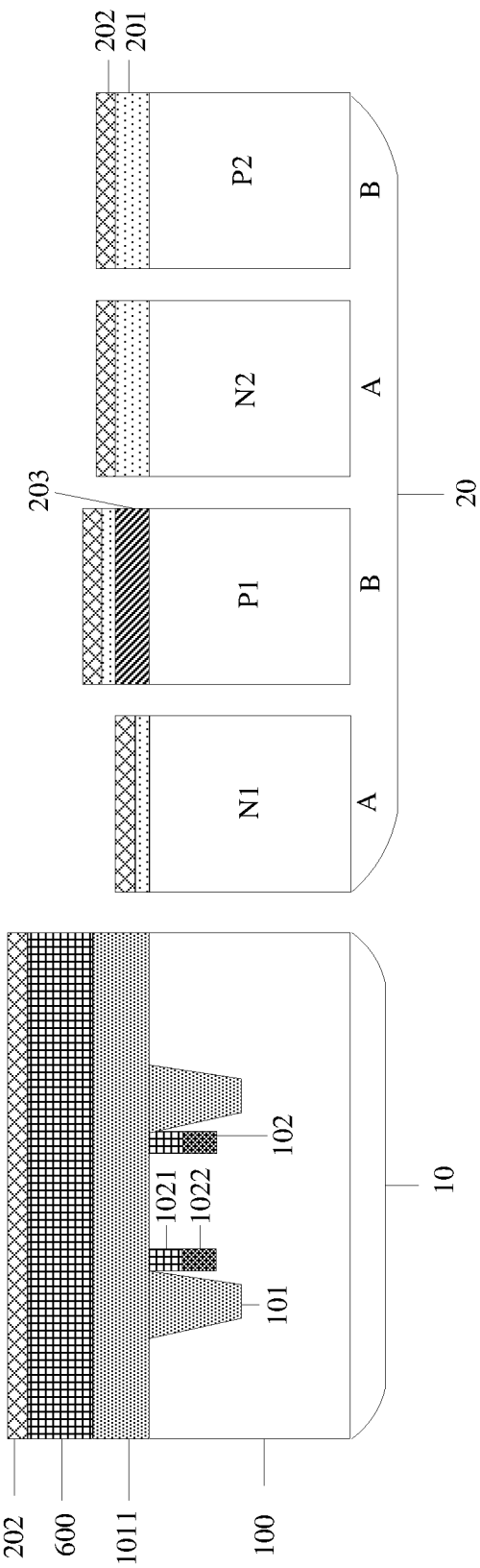
Figure 4:
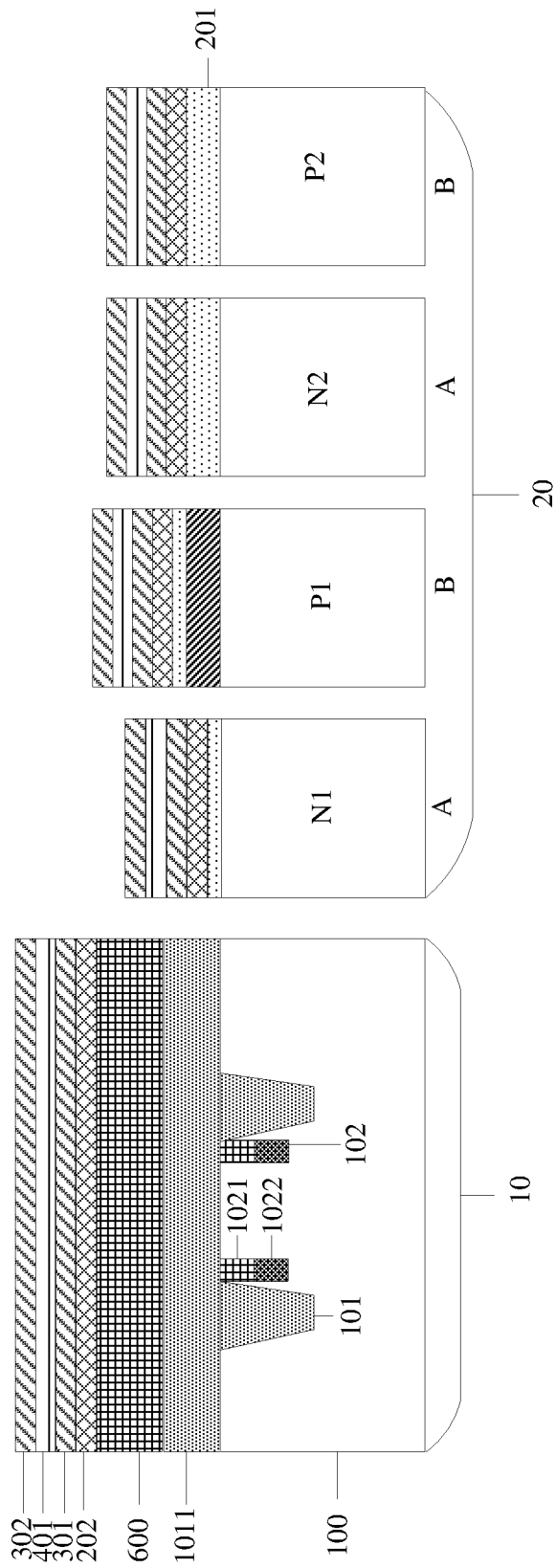

As shown in FIG. 2, FIG. 3, and FIG. 4, the first dielectric layer 201, the second dielectric layer 202, the first barrier layer 301, the first work function layer 401, and the second barrier layer 302 are deposited on the substrate 100. A thickness of the first dielectric layer 201 in the second N area N2 is greater than a thickness of the first dielectric layer 201 in the first N area N1. A thickness of the first dielectric layer 201 in the second P area P2 is greater than a thickness of the first dielectric layer 201 in the first P area P1.

Before the first dielectric layer 201, the second dielectric layer 202, the first barrier layer 301, the first work function layer 401, and the second barrier layer 302 are formed on the substrate 100, a strain layer 203 is required to be formed on the substrate 100 in the first P area P1. The first dielectric layer 201, the second dielectric layer 202, the first barrier layer 301, the first work function layer 401, and the second barrier layer 302 are formed on the substrate 100, and A barrier material layer 1011 and an isolation layer 600 are successively formed on the substrate 100 in the array area 10. The first dielectric layer 201, the second dielectric layer 202, the first barrier layer 301, the first work function layer 401, and the second barrier layer 302 are formed on the substrate 100, and the first dielectric layer 201 in the array area 10 is removed. An etching method may be utilized to remove the first dielectric layer 201 in the array area 10, and may include dry etching or wet etching. The specific etching method may be selected according to actual processing.

The first dielectric layer 201 may be made of a material such as silicon oxide and silicon oxynitride. The second dielectric layer 202 (HK layer) may be made of a material such as hafnium silicon oxynitride, barium strontium titanate, strontium titanate, and barium strontium tantalate. A dielectric constant of the second dielectric layer 202 is greater than a dielectric constant of the first dielectric layer 201. The strain layer 203 may be made of a germanium silicon compound, that is, SiGe. The isolation layer 600 may be made of a material such as silicon nitride and silicon oxide. The materials of the above film layers include, but are not limited thereto, which are not specifically limited in the disclosure.

The material deposition of the work function layer in the first area A (N1 area and N2 area) is mainly lanthanum oxide (LaO). The material of the work function layer in the second area B (P1 area and P2 area) is mainly alumina (AlO). The first work function layer 401 is an alumina layer. After the second dielectric layer 202 is formed on the first area A and the second area B, the first work function layer 401 is deposited on the first area A and the second area B. The first work function layer 401 may be an alumina layer, and the first barrier layer 301 and the second barrier layer 302 are respectively deposited under and above the first work function layer 401. The first barrier layer 301 and the second barrier layer 302 may be made of a material such as titanium nitride (TiN) and thallium nitride, but it is not limited to the above materials.

Since the first work function layer 401 includes a metallic oxide, the diffusion capacity of oxygen element and metallic element in the work function layer is required to be considered in the subsequent process. In order to block the first work function layer 401 from the second dielectric layer 202, the first barrier layer 301 is deposited between the first work function layer 401 and the second dielectric layer 202. Since the first barrier layer 301 needs to have a function of allowing the diffusion of the atoms in the work function layer, and in order to enhance the diffusion capacity of the first barrier layer 301 on the atoms of the work function layer, in the disclosure, a value of a ratio of metallic element to non-metallic element in the first barrier layer 301 may be set to be less than 1, and may range from 0.5 to 0.95, so as to enhance the diffusion capacity of the atoms of the work function layer. By taking the first barrier layer 301 being a titanium nitride layer as an example, a ratio of titanium to nitrogen in the first barrier layer 301 may be set to 0.8. That is to say, the first barrier layer 301 is a nitrogen-rich layer. As such, in the subsequent processing, the atoms in the first work function layer 401 are easier to be diffused through the TiN layer with a titanium-to-nitrogen ratio of 0.8.

In the disclosure, the content ratio of the metallic element to the non-metallic element in the first barrier layer 301 is less than 1, which may range from 0.5 to 0.95. However, the above ratio range is not specifically limited in the disclosure, and may be selected according to actual use requirements.

At S30, the second barrier layer 302 in the first area A and the first work function layer 401 in the first area A are removed, and then a second work function layer 402, a third barrier layer 303, and a first conductive layer 501 are successively formed on the substrate 100.

Figure 11:
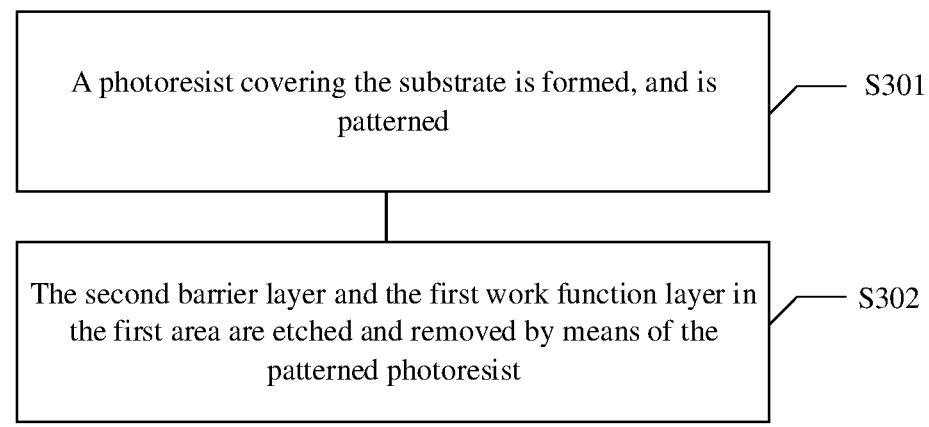
FIG. 11 is a schematic flowchart of a method for removing a film layer for the first time in a first area in a method for manufacturing a semiconductor device according to an exemplary embodiment of the disclosure.

Since the work function layer in the first area A (N1 area and N2 area) is mainly composed of lanthanum oxide (LaO), the first work function layer 401 and the second barrier layer 302 in the first area A are required to be removed. As shown in FIG. 11, a specific removing method includes the following steps.

At S301, a photoresist PR covering the first area A is formed, and the first photoresist PR is patterned.

At S302, the second barrier layer 302 and the first work function layer 401 in the first area A are etched and removed by means of the patterned photoresist PR.

Figure 5:
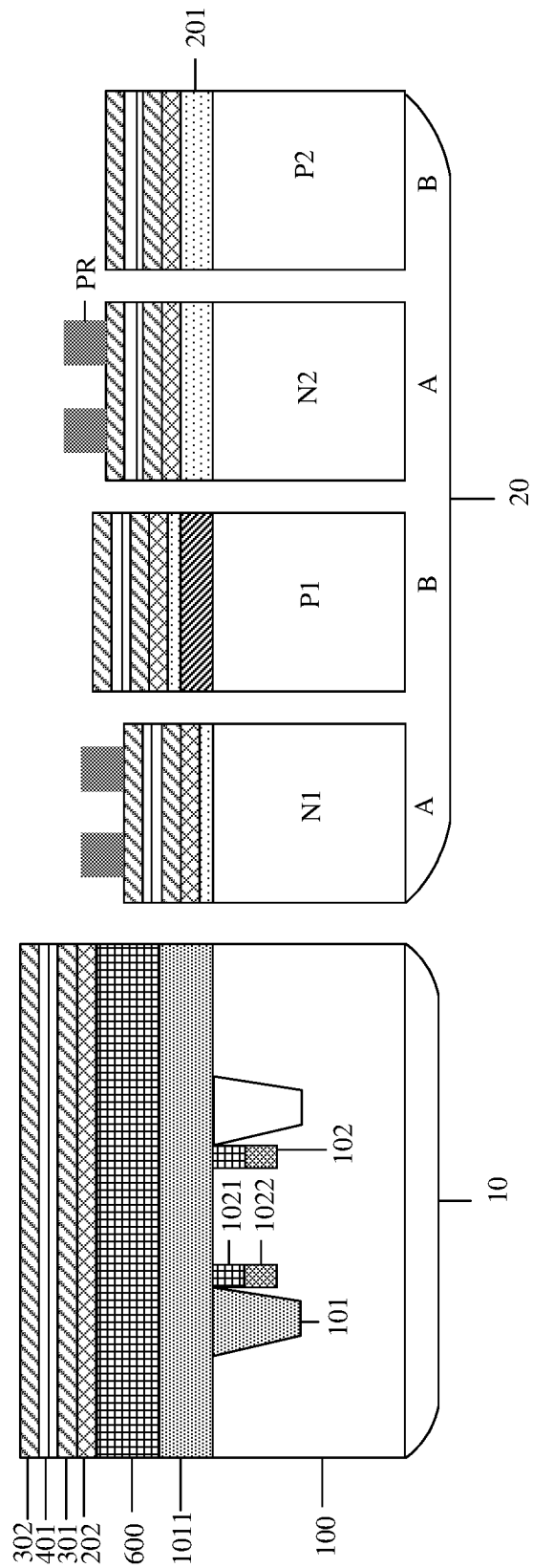
Figure 6:
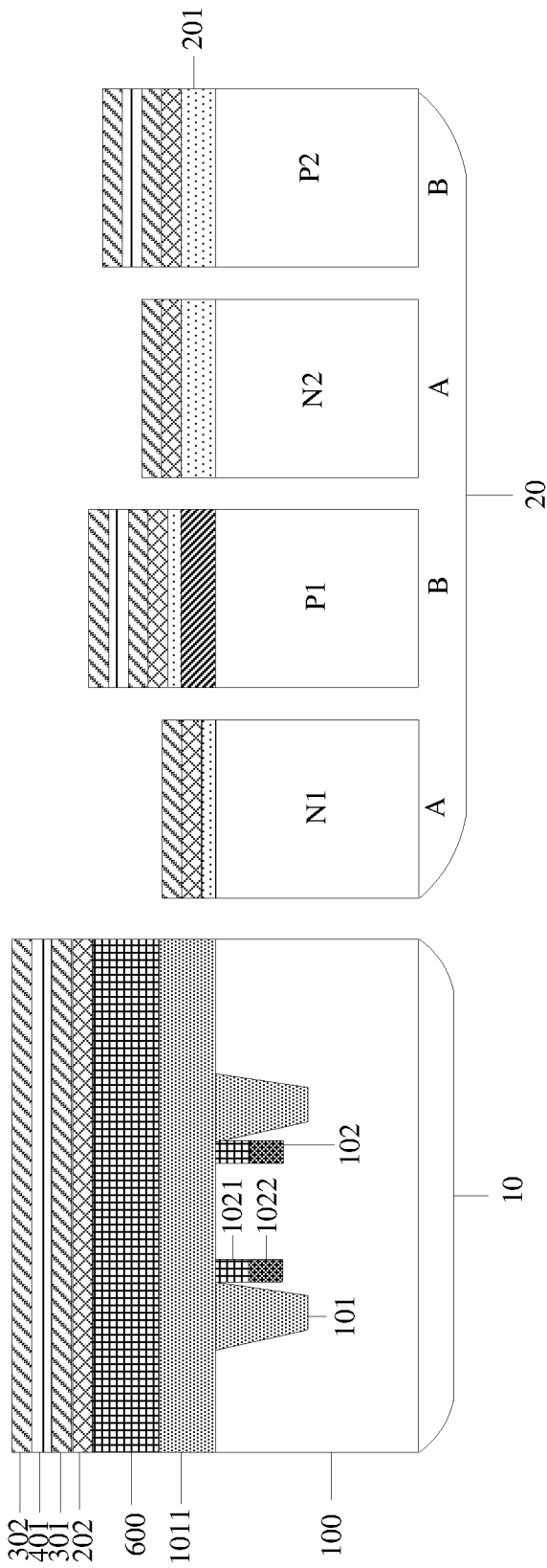

As shown in FIG. 5 and FIG. 6, the first area A is etched by using the photoresist PR, to remove the second barrier layer 302 and the first work function layer 401. The etching method may adopt dry etching, wet etching, or a combination of the dry etching and the wet etching. The specific etching method may be selected according to actual requirement, and is not limited in the disclosure.

Figure 7:
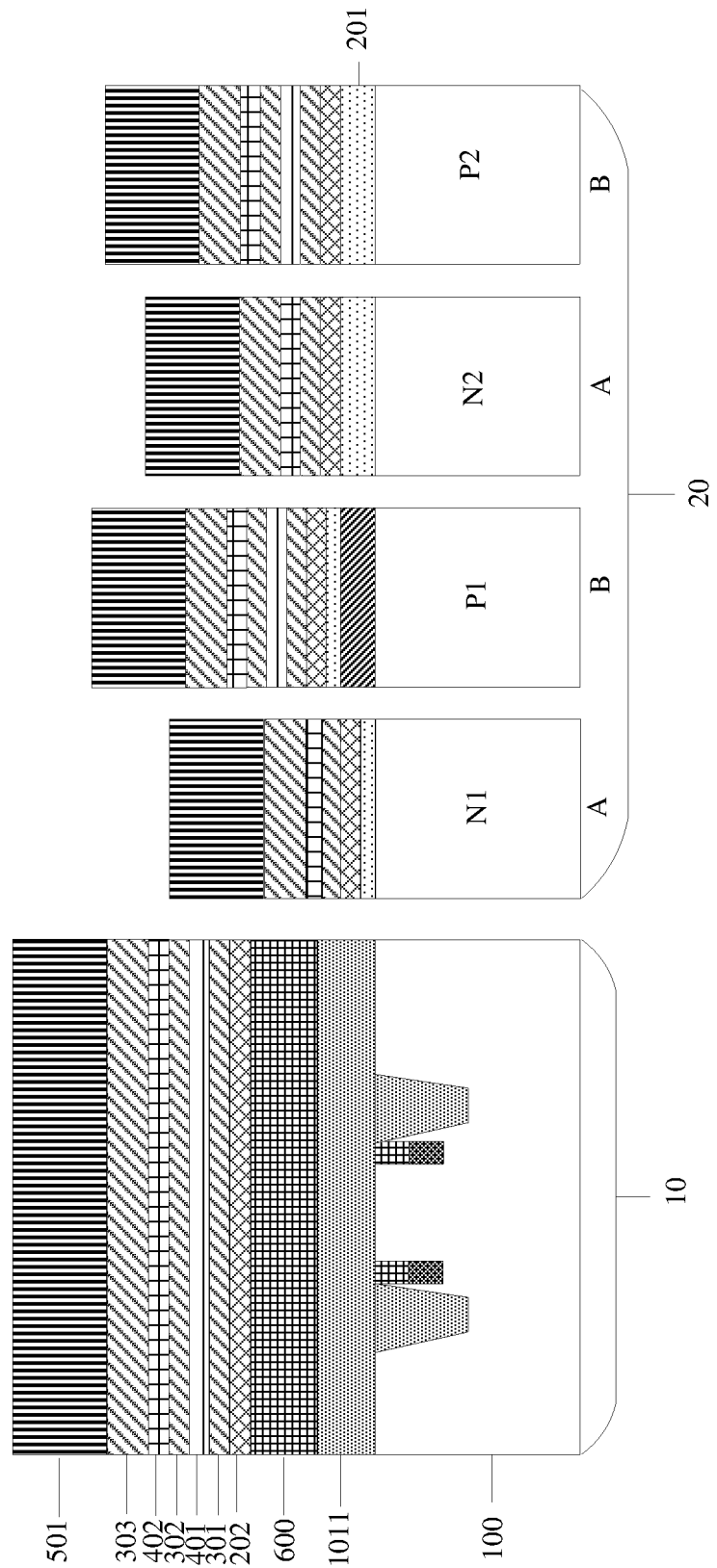

As shown in FIG. 7, after the first area A is etched to remove the second barrier layer 302 and the first work function layer 401, the second work function layer 402, the third barrier layer 303, and the first conductive layer 501 are successively formed on the substrate 100. The second work function layer 402 may be a LaO layer. Through the above steps, in the first area A, the second work function layer 402 is located between the first barrier layer 301 and the third barrier layer 303, and in the second area B, the second work function layer 402 is located between the second barrier layer 302 and the third barrier layer 303. The first conductive layer 501 is deposited on the third barrier layer 303. The first conductive layer 501 may be made of undoped polycrystalline silicon (poly).

In the disclosure, by taking the barrier layer being the TiN layer as an example, in the first area A (N1 area and N2 area), the first barrier layer 301 is arranged under the second work function layer 402 (LaO layer). In order to easily diffuse the atoms in the work function layer, the titanium-to-nitrogen ratio in the first barrier layer 301 is selected as 0.8. The third barrier layer 303 is arranged between the second work function layer 402 (LaO layer) and the first conductive layer 501. In order to prevent the second work function layer 402 (LaO layer) from upward diffusing into the first conductive layer 501, the titanium-to-nitrogen ratio in the third barrier layer 303 is set to 1.2, that is, the third barrier layer is a titanium-rich layer. Since the content of the metallic element in the third barrier layer 303 is higher than that of the non-metallic element in the third barrier layer, the energy of capturing oxygen elements is relatively high, a resistance value is decreased, and the atoms in the work function layer are not easy to diffuse, so that in the subsequent processing, the atoms in the first work function layer 401 and the second work function layer 402 that are on two sides of the third barrier layer 303 are difficult to diffuse, thereby achieving a blocking effect.

The first conductive layer 501, the third barrier layer 303, the second work function layer 402, the second barrier layer 302, the first work function layer 401, and the first barrier layer 301 are provided successively in the second area B (P1 area and P2 area) from top to bottom. Similar to a processing principle of the first area A, the titanium-to-nitrogen ratio in the first barrier layer 301 is set to 0.8, and titanium-to-nitrogen ratio in each of the second barrier layer 302 and the third barrier layer 303 are set to 1.2. When the content ratio of the metallic element to the non-metallic element in the second barrier layer 302 and the third barrier layer 303 is greater than 1, the capacity of the barrier layer for capturing the oxygen elements is increased, and the resistance is decreased, so that metal diffusion in the work function layer becomes difficult. When the content ratio of the metallic element to the non-metallic element in the first barrier layer 301 is less than 1, the resistance of the barrier layer is increased, so that the metal diffusion in the work function layer becomes easy. The effect of each film layer in the second area B is described as above, and is not described herein again.

In the disclosure, the content ratio of the metallic element to the non-metallic element in the first barrier layer 301 is less than the content ratio of the metallic element to the non-metallic element in the second barrier layer 302 and the third barrier layer 303. The content ratio of the metallic element to the non-metallic element in the first barrier layer 301 is less than 1, and the content ratio of the metallic element to the non-metallic element in the second barrier layer 302 and the third barrier layer 303 is greater than 1. Further, the content ratio of the metallic element to the non-metallic element in the first barrier layer 301 ranges from 0.5 to 0.95. The content ratio of the metallic element to the non-metallic element in each of the second barrier layer 302 and the third barrier layer 303 ranges from 1.05 to 1.5. The disclosure includes, but is not limited to, the above range values, and the content ratio of the metallic element to the non-metallic element in each of the barrier layers may be determined according to actual use requirements.

At S40, thermal treatment is performed on the substrate 100, so that atoms in the second work function layer 402 in the first area A are diffused into the second dielectric layer 202, atoms in the first work function layer 401 in the second area B are diffused into the second dielectric layer 202, and an interface interaction occurs between the second dielectric layer 202 and the first dielectric layer 201.

Figure 8:
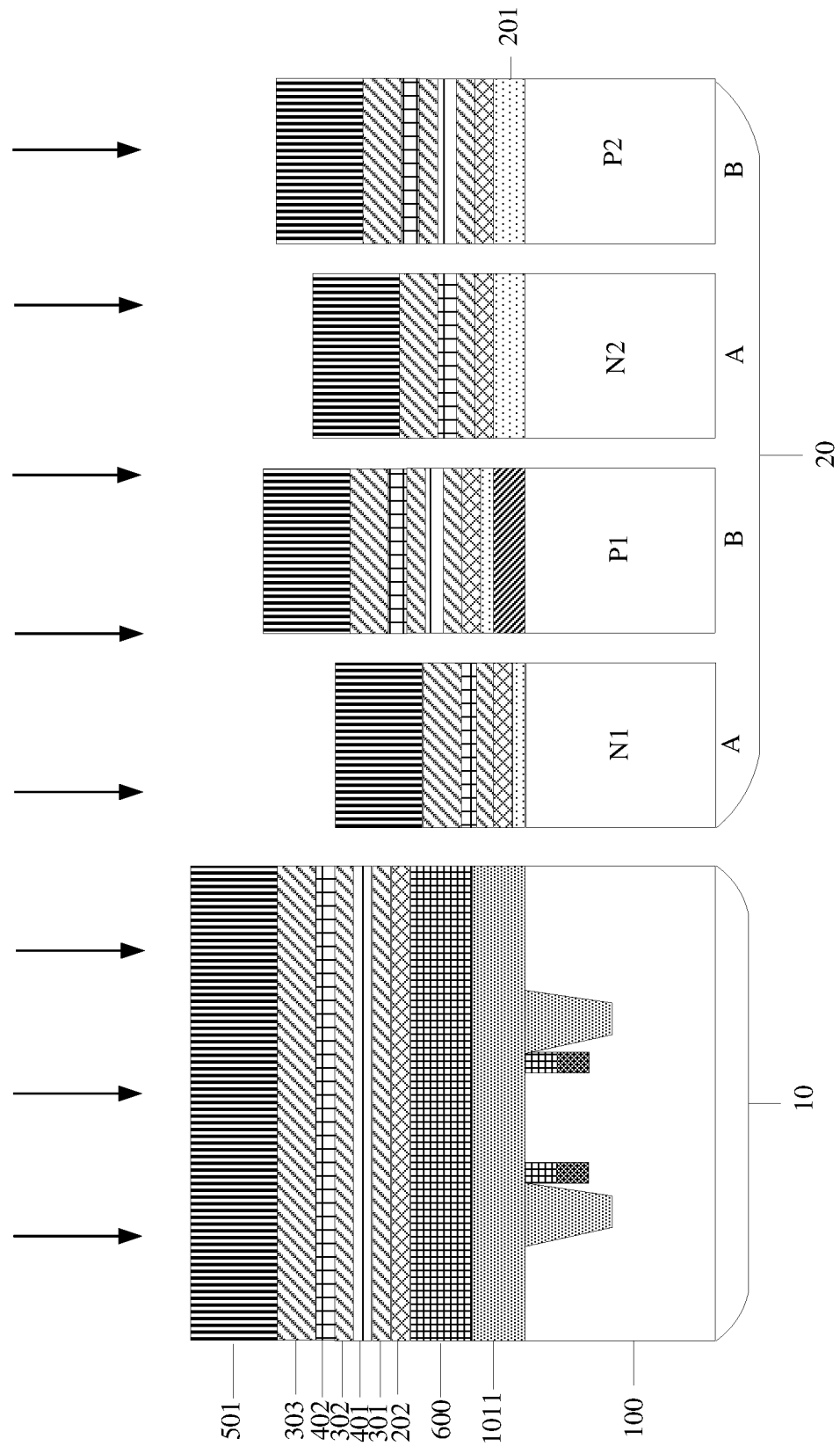

As shown in FIG. 8, after the above film layers are formed on the substrate 100, a thermal treatment is performed on the substrate 100, so that the interface interaction occurs in an interface between the first dielectric layer 201 and the second dielectric layer 202. For example, a dipole interaction occurs in the interface between the first dielectric layer 201 and the second dielectric layer 202. The dipole interaction is an interaction among polar molecules, that is, an attraction between an end of one polar molecule with a partial positive charge and an end of the other molecule with a partial negative charge. The polar molecules may generate dipole moments due to uneven charge distribution. When the polar molecules are close to each other, electrical attraction is caused.

Figure 12:
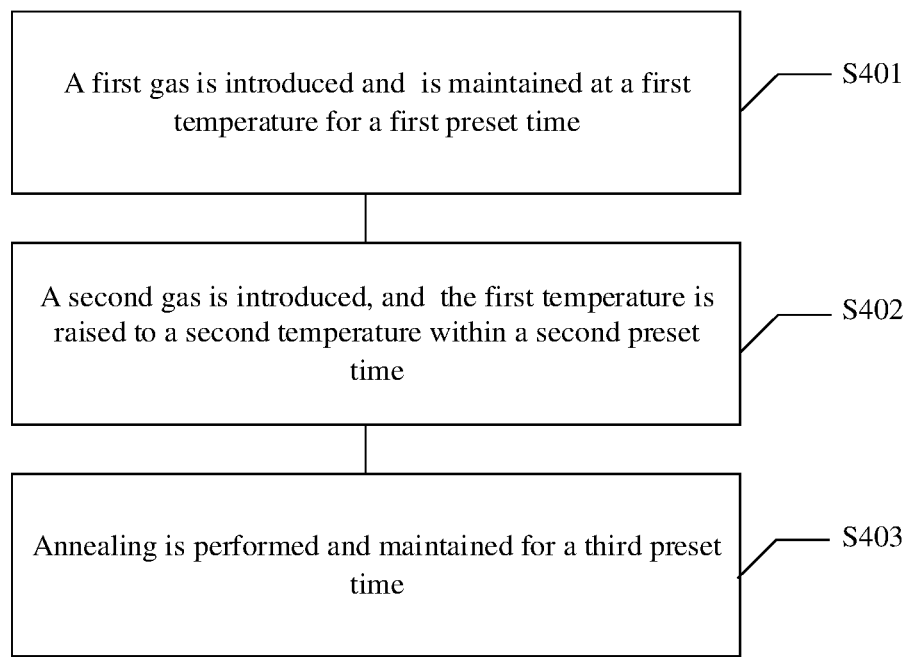
FIG. 12 is a schematic flowchart of a thermal treatment method in a method for manufacturing a semiconductor device according to an exemplary embodiment of the disclosure.

In the method for manufacturing a semiconductor provided in the disclosure, preferably, a thermal treatment process adopts a Rapid Thermal Anneal (RTA) process to perform thermal treatment on the substrate 100. As shown in FIG. 12, the thermal treatment method includes the following steps.

At S401, a first gas is introduced and is maintained at a first temperature for a first preset time.

At S402, a second gas is introduced, and the first temperature is raised to a second temperature within a second preset time.

At S403, annealing is performed for a third preset time.

In S401 to S403, the first preset time is greater than the second preset time and the third preset time, and the second preset time is less than the third preset time. That is to say, the above three preset times are the second preset time, the third preset time, and the first preset time in an ascending order. The first gas includes an inert gas. The second gas includes an oxidizing gas. A flow rate of the first gas is greater than a flow rate of the second gas.

In the above thermal treatment process flow, the first gas may be the inert gas such as nitrogen and helium, and the flow rate of the first gas ranges from 10000 sccm to 3000 sccm (standard milliliter/minute). The second gas may be the oxidizing gas such as oxygen, and the flow rate of the second gas ranges from 300 sccm to 1000 sccm. The flow rate of the first gas is greater than the flow rate of the second gas. The first temperature value ranges from 300° C. to 800° C., the second temperature ranges from 400° C. to 1500° C., and a heating rate may range from 50° C./S to 150° C./S. The second temperature is higher than the first temperature. The first preset time may range from 10 S to 30 S (second), the second preset time may range from 3.3 S to 7.3 S, and the third preset time may range from 5 S to 15 S. The preset times are the second preset time, the third preset time, and the first preset time in the ascending order.

Specifically, in the thermal treatment process, the first gas which is nitrogen may be introduced; the flow rate of the nitrogen is 20000 sccm; the gas is maintained at the first temperature for the first preset time; the first temperature may be 550° C.; and the first preset time may be 20 S. Then, the second gas which may be oxygen is introduced; 650 sccm of oxygen is introduced while 20000 sccm of the first gas which may be nitrogen is maintained to be introduced, so that the temperature is raised from the first temperature to the second temperature. The first temperature may be 550° C., the second temperature may be 950° C., the heating rate may be 75° C./S, and heating time is the second preset time, that is, the heating time (second preset time) is about 5.3 S. Spike annealing is performed on the substrate 100, in which the temperature value is maintained at the second temperature for the third preset time, the second temperature may be 950° C., and the third preset time may be 10 S; and 650 sccm of the second gas (oxygen) and 20000 sccm of the first gas (nitrogen) are maintained to be introduced.

It is to be noted that, parameter values in the above thermal treatment steps are merely exemplary, and each parameter value in the specific treatment steps may be selected according to actual process requirements, which is not specifically limited in the disclosure.

At S50, the first conductive layer 501, the third barrier layer 303, the second work function layer 402, and the first barrier layer 301 in the first area A are removed, and the first conductive layer 501, the third barrier layer 303, the second work function layer 402, the second barrier layer 302, the first work function layer 401, and the first barrier layer 301 in the array area 10 and the second area B are removed.

Figure 9:
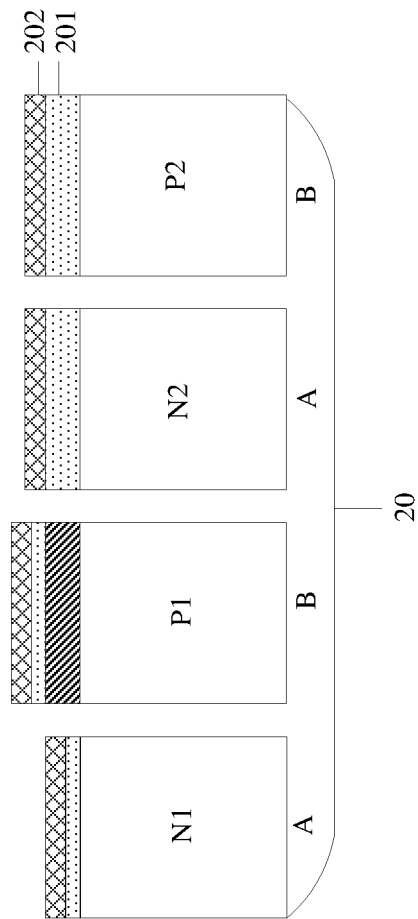
Figure 9:
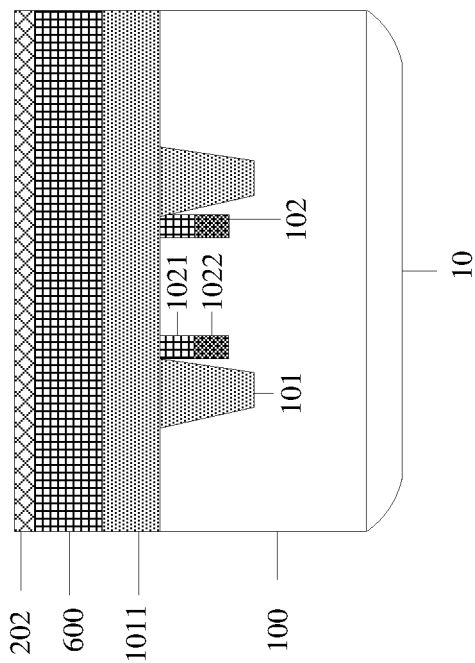

As shown in FIG. 9, high-temperature RTA process is performed on the substrate 100. After RTA, the first conductive layer 501, the third barrier layer 303, the second work function layer 402, and the first barrier layer 301 in the first area A are removed, and the first conductive layer 501, the third barrier layer 303, the second work function layer 402, the second barrier layer 302, the first work function layer 401, and the first barrier layer 301 in the array area 10 and the second area B are removed.

At S60, the fourth barrier layer 304 and the second conductive layer 502 are formed in the first area A and the second area B. A content ratio of metallic element to non-metallic element in the fourth barrier layer 304 is same as a content ratio of metallic element to non-metallic element in the second barrier layer 302 and the third barrier layer 303.

Figure 10:
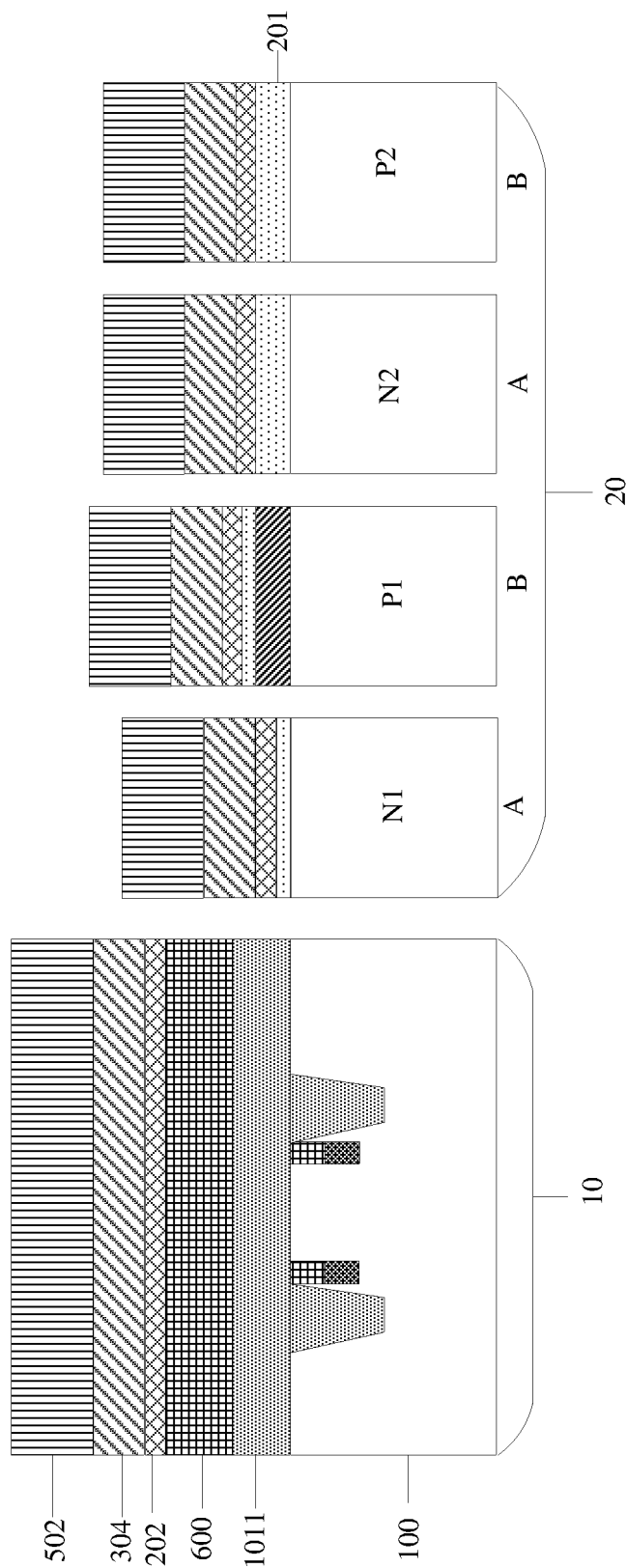

After S10 to S50 are completed, as shown in FIG. 10, the fourth barrier layer 304 is deposited and formed in the first area A and the second area B, and the second conductive layer 502 is deposited on the fourth barrier layer 304. The content ratio of the metallic element to the non-metallic element in the fourth barrier layer 304 is required to be greater than 1. The fourth barrier layer 304 plays a role of capturing more oxygen elements, and may ensure that metals are difficult to diffuse. For example, the fourth barrier layer 304 is the TiN layer, in which the titanium-to-nitrogen ratio may be 1.2. In this way, it can be ensured that the fourth barrier layer 304 may prevent metallic elements in other film layers from diffusing after a metal gate is formed on the semiconductor device.

The content ratio of the metallic element to the non-metallic element in the fourth barrier layer 304 may be the same as the content ratio of the metallic element to the non-metallic element in the second barrier layer 302. In this way, a processing of the semiconductor device may be simplified, so that processing time can be saved, and processing efficiency can be enhanced.

In addition, the content ratio of the metallic element to the non-metallic element in the fourth barrier layer 304 is greater than 1. The content ratio of the metallic element to the non-metallic element may range from 1.05 to 1.5, which is not specifically limited in the disclosure.

The second conductive layer 502 may be a doped polycrystalline silicon layer, or may be made of other material suitable for a semiconductor film layer, which is not specifically limited in the disclosure.

Each of the first barrier layer 301, the second barrier layer 302, the third barrier layer 303, and the fourth barrier layer 304 may be deposited by means of Physical Vapor Deposition (PVD). The PVD method includes vacuum evaporation, sputter coating, arc plasma coating, ion coating, molecular beam epitaxy, and the like. In the disclosure, a Radio Frequency Physical Vapor Deposition (RFPVD) method is preferably adopted to adjust the ratio of the metallic element to the non-metallic element in each barrier film layer, but the method is not limited thereto.

According to the method for manufacturing a semiconductor device provided in the disclosure, in the semiconductor processing, by adjusting the content ratio of the metallic element to the non-metallic element in different barrier layers, functions of different barrier layers are further enhanced. For example, when it is needed to enhance the diffusivity of the work function layer near the barrier layer, the content ratio of the metallic element to the non-metallic element may be adjusted to be less than 1, so that the metallic elements therein can be diffused more easily. When it is required to enhance the blocking effect of the barrier layer, the content ratio of the metallic element to the non-metallic element in the barrier layer may be adjusted to be greater than 1, so that the capacity of the barrier layer for capturing the oxygen elements can be enhanced, and the atoms in the work function layer are not easy to diffuse. During the processing of the semiconductor, different ratios can be selected according to different functions of the barrier layers, which can optimize semiconductor processing, and improve the performance of the device.

It is to be noted that, although the various steps of the method for manufacturing a semiconductor device in the disclosure are described in a particular order in the drawings, this does not require or imply that the steps must be performed in the particular order, or that all shown steps must be performed to achieve desired results. Additionally or alternatively, certain steps may be omitted, a plurality of steps may be combined into one step for execution, and/or one step may be decomposed into a plurality steps for execution, and the like.

The disclosure further provides a semiconductor device, and is manufactured by the above method for manufacturing a semiconductor device. As shown in FIG. 9, the semiconductor device includes a substrate 100, a first dielectric layer 201, a second dielectric layer 202, a barrier layer 304, and a conductive layer 502.

The substrate 100 includes an array area 10 and a peripheral area 20, and the peripheral area 20 includes a first area A and a second area B. The first dielectric layer 201 is located in the peripheral area 20. The second dielectric layer 202 is located on the first dielectric layer 201 and in the array area 10, and an interface interaction occurs in an interface between the first dielectric layer 201 and the second dielectric layer 202. The barrier layer 304 is located on the second dielectric layer 202. The conductive layer 502 is located on the barrier layer 304. A content ratio of a metallic element to a non-metallic element in the barrier layer 304 is greater than 1.

The first dielectric layer 201 may be a silicon oxide layer. The second dielectric layer 202 may be a hafnium silicon oxynitride layer (HK layer). A dielectric constant of the second dielectric layer 202 is greater than a dielectric constant of the first dielectric layer 201. The barrier layer 304 may be a silicon nitride layer. The conductive layer 502 may be a doped polycrystalline silicon layer. However, the materials of the film layers of the disclosure include, but are not limited to, the above materials. Appropriate material may be selected according to a structure and processing of an actual semiconductor device, which is not specifically limited in the disclosure.

The semiconductor device provided in the disclosure is manufactured by the above method for manufacturing a semiconductor. During processing, the barrier layers having different content ratios of the metallic element to the non-metallic element are adopted for processing, so that functions of the barrier layers are further optimized. Therefore, a processing process of HKMG can be optimized, and the performance of the semiconductor device can be further improved.

Other implementation solutions of the disclosure will readily occur to those skilled in the art upon consideration of the specification and practice of the invention disclosed herein. The disclosure is intended to cover any variations, uses, or adaptations of the disclosure that follow the general principles of the disclosure and include common knowledge or techniques in the technical field that are not disclosed by the disclosure. The specification and examples are considered to be exemplary only, with the true scope and spirit of the disclosure being indicated by the appended claims.

The invention claimed is:

1. A method for manufacturing a semiconductor device, comprising:
providing a substrate comprising an array area and a peripheral area, wherein the peripheral area comprises a first area and a second area;
successively forming a first dielectric layer, a second dielectric layer, a first barrier layer, a first work function layer, and a second barrier layer on the substrate;
removing the second barrier layer in the first area and the first work function layer in the first area, and then successively forming a second work function layer, a third barrier layer, and a first conductive layer on the substrate;
performing a thermal treatment on the substrate, so that atoms in the second work function layer in the first area are diffused into the second dielectric layer, atoms in the first work function layer in the second area are diffused into the second dielectric layer, and an interface interaction occurs between the second dielectric layer and the first dielectric layer;
removing the first conductive layer, the third barrier layer, the second work function layer, and the first barrier layer in the first area, and removing the first conductive layer, the third barrier layer, the second work function layer, the second barrier layer, the first work function layer, and the first barrier layer in the array area and the second area; and
forming a fourth barrier layer and a second conductive layer in the first area and the second area,
wherein a content ratio of a metallic element to a non-metallic element in the first barrier layer is less than a content ratio of a metallic element to a non-metallic element in the second barrier layer and the third barrier layer.

2. The method for manufacturing a semiconductor device of claim 1, wherein the content ratio of the metallic element to the non-metallic element in the first barrier layer is less than 1, and the content ratio of the metallic element to the non-metallic element in the second barrier layer and the third barrier layer is greater than 1.

3. The method for manufacturing a semiconductor device of claim 2, wherein the content ratio of the metallic element to the non-metallic element in the first barrier layer ranges from 0.5 to 0.95, and the content ratio of the metallic element to the non-metallic element in the second barrier layer and the third barrier layer ranges from 1.05 to 1.5.

4. The method for manufacturing a semiconductor device of claim 1, wherein a content ratio of a metallic element to a non-metallic element in the fourth barrier layer is greater than 1.

5. The method for manufacturing a semiconductor device of claim 1, wherein the content ratio of the metallic element to the non-metallic element in the fourth barrier layer is same as the content ratio of the metallic element to the non-metallic element in the second barrier layer.

6. The method for manufacturing a semiconductor device of claim 1, wherein, in the first area, atom diffusion in the second work function layer occurs between the second work function layer and the second dielectric layer; and in the second area, atom diffusion in the first work function layer occurs between the first work function layer and the second dielectric layer.

7. The method for manufacturing a semiconductor device of claim 1, wherein the first area comprises an N area forming an N-type device, and the N area comprises a first N area and a second N area; and the second area comprises a P area forming a P-type device, and the P area comprises a first P area and a second P area.

8. The method for manufacturing a semiconductor device of claim 7, wherein a thickness of the first dielectric layer of the second N area is greater than a thickness of the first dielectric layer of the first N area; and a thickness of the first dielectric layer in the second P area is greater than a thickness of the first dielectric layer in the first P area.

9. The method for manufacturing a semiconductor device of claim 8, before said successively forming a first dielectric layer, a second dielectric layer, a first barrier layer, a first work function layer, and a second barrier layer on the substrate, further comprising:
forming a strain layer on the substrate in the first P area.

10. The method for manufacturing a semiconductor device of claim 1, wherein a dielectric constant of the second dielectric layer is greater than a dielectric constant of the first dielectric layer.

11. The method for manufacturing a semiconductor device of claim 1, wherein said successively forming a second work function layer, a third barrier layer, and a first conductive layer on the substrate further comprises:
removing the second work function layer and the third barrier layer in the second area, and forming the first conductive layer on the substrate.

12. The method for manufacturing a semiconductor device of claim 1, before said successively forming a first dielectric layer, a second dielectric layer, a first barrier layer, a first work function layer, and a second barrier layer on the substrate, further comprising:
successively forming a barrier material layer and an isolation layer on the substrate in the array area.

13. The method for manufacturing a semiconductor device of claim 1, wherein said successively forming a first dielectric layer, a second dielectric layer, a first barrier layer, a first work function layer, and a second barrier layer on the substrate further comprises:
removing the first dielectric layer in the array area.

14. The method for manufacturing a semiconductor device of claim 1, wherein said performing a thermal treatment on the substrate comprises:
introducing a first gas, and maintaining the first gas at a first temperature for a first preset time;
introducing a second gas, and raising the first temperature to a second temperature within a second preset time; and
performing an annealing for a third preset time.

15. The method for manufacturing a semiconductor device of claim 14, wherein the first preset time is greater than the second preset time and the third preset time, and the second preset time is less than the third preset time.

16. The method for manufacturing a semiconductor device of claim 14, wherein the first gas comprises an inert gas; the second gas comprises an oxidizing gas; and a flow rate of the first gas is greater than a flow rate of the second gas.

17. The method for manufacturing a semiconductor device of claim 1, wherein said removing the second barrier layer in the first area and the first work function layer in the first area comprises:
forming a photoresist covering the substrate, and patterning the photoresist to yield a patterned photoresist; and
etching and removing the second barrier layer and the first work function layer in the first area by means of the patterned photoresist.

* * * * *